(12) United States Patent
Cho et al.

(10) Patent No.: US 7,560,746 B2
(45) Date of Patent: Jul. 14, 2009

(54) LIGHT EMITTING DIODES AND DISPLAY APPARATUSES USING THE SAME

(75) Inventors: Jae-hee Cho, Yongin-si (KR); Martin Schubert, Troy, NY (US); E. Fred Schubert, Troy, NY (US); Jong-kyu Kim, Troy, NY (US); Cheol-soo Sone, Yongin-si (KR)

(73) Assignees: Samsung Electro-Mechanics Co., Ltd., Gyeonggi-do (KR); Rensselaer Polytechnic Institute, Troy, NY (US)

( * ) Notice: Subject to any disclaimer, the term of this patent is extended or adjusted under 35 U.S.C. 154(b) by 316 days.

(21) Appl. No.: 11/711,877

(22) Filed: Feb. 28, 2007

(65) Prior Publication Data

US 2008/0204626 A1    Aug. 28, 2008

(51) Int. Cl.
*H01L 33/00* (2006.01)
(52) U.S. Cl. .......................................... 257/98; 349/61
(58) Field of Classification Search ................ 257/98; 349/61; 313/506
See application file for complete search history.

(56) References Cited

U.S. PATENT DOCUMENTS 4,766,470 A * 8/1988 Scholl et al. .................. 257/94
5,264,715 A   11/1993 Guenter et al.

OTHER PUBLICATIONS

Korean Office Action and English language translation (dated Jan. 24, 2008) for counterpart Korean Application No. 10-2007-0026247 is provided for the purpose of certification under 37 C.F.R. § 1.97(e).

* cited by examiner

*Primary Examiner*—Mark Prenty
(74) *Attorney, Agent, or Firm*—Harness, Dickey & Pierce, P.L.C.

(57) ABSTRACT

In a light emitting diode, a first semiconductor layer supplies electrons, and a second semiconductor layer supplies holes. An active layer is formed between the first and second semiconductor layers. The active layer receives electrons and holes, and emits light in response to coupling between the electrons and the holes. A first reflective layer is formed on a bottom portion of the first semiconductor layer, and a second reflective layer is formed on a top portion of the second semiconductor layer. The light emitted from the active layer exits toward a side of the active layer.

21 Claims, 6 Drawing Sheets

LIGHT EMITTING DIODES AND DISPLAY APPARATUSES USING THE SAME

BACKGROUND

Description of the Related Art

Light emitting diodes (LEDs) are becoming increasingly more popular because LEDs are relatively efficient and eco-friendly. For example, LEDs are more widely used as light sources for vehicles, display apparatuses, optical communication systems, and illumination apparatuses. However, because polarization characteristics of light are often used in such application fields, all light emitted from LEDs is not actually used, thereby decreasing optical efficiency. The use of polarization characteristics of light may be relatively important in display devices and/or optical communication systems using liquid crystal displays (LCDs).

FIG. 1A illustrates how light is transmitted in a conventional liquid crystal display (LCD). FIG. 1B illustrates how light is blocked in a conventional liquid crystal display (LCD).

Referring to FIG. 1A, a conventional LCD is formed by injecting a liquid crystal material 16 between substrates (not shown) in which first and second electrodes 14 and 18 are respectively formed. Molecular arrangement of the liquid crystal material 16 may be changed according to an electric field generated by a voltage supplied between the first and second electrodes 14 and 18, and light transmittance of the liquid crystal material 16 varies according to the molecular arrangement of the liquid crystal martial 16. The LCD displays an image by varying light transmittance of the liquid crystal material 16 in this way. For example, the conventional LCD may perform a shutter function by changing the polarization direction of light to transmit or block the light. Consequently, the LCD only uses light polarized in one direction. However, because light 10 emitted from a light source is generally non-polarized light, first and second polarizers 12 and 20 are formed on both sides of the LCD. The first and second polarizers 12 and 20 transmit light having different polarization directions. A polarizer such as the first and second polarizer 12 and 20 transmit a component of light polarized in a particular or desired polarization direction (e.g., a vertical direction) and absorb other components of the light polarized in other directions (e.g., a horizontal direction). In one example, because the conventional polarizer absorbs about 50% of incident light, the optical efficiency of a device using the polarizer decreases.

Referring still to FIG. 1A, a first polarized light of light 10 emitted from a light source (not shown) is transmitted by the first polarizer 12, and the first polarization direction is changed into a second polarized light while the first polarized light passes through the liquid crystal material 16. The second polarized light transmits the second polarizer 20.

Referring to FIG. 1B, a second polarized light of light 10 emitted from the light source is transmitted by the first polarizer 12 and passes through the liquid crystal material 16 to which a voltage is applied by the first and second electrodes 14 and 18. In this example, the polarization direction of the first polarized light does not change while the first polarized light passes through the liquid crystal material 16 because the molecular arrangement of the liquid crystal material 16 is changed by the applied voltage. Therefore, the first polarized light may be blocked by the second polarizer 20. In each pixel of a conventional liquid crystal panel of the LCD, light may be transmitted or blocked in the manner as described in FIGS. 1A and 1B to display images. However, as described above, conventional LCDs may suffer optical losses due to first and second conventional polarizers 12 and 20.

SUMMARY

Example embodiments relate to edge type light emitting diodes capable of providing polarized light and display apparatuses using the same. At least one example embodiment provides an edge type light emitting diode (LED) supplying polarized light and display apparatuses having improved optical efficiency. At least one example embodiment provides polarized light while reducing optical loss and/or improves efficiency in optical coupling.

At least one example embodiment provides an edge type LED. According to at least this example embodiment, the LED may include an n-type semiconductor layer supplying electrons, a p-type semiconductor layer supplying holes, an active layer formed between the n-type and p-type semiconductor layers, a first reflective layer formed on a bottom portion of the n-type semiconductor layer, and a second reflective layer formed on a top portion of the p-type semiconductor layer. The active layer may be configured to receive the electrons and the holes and emit light when the electrons couple to the holes. The light emitted from the active layer may exit toward a side of the active layer.

At least one other example embodiment provides a display apparatus including a light source formed of an LED and a liquid crystal panel forming an image using light emitted from the light source. According to at least this example embodiment, the LED may include an n-type semiconductor layer supplying electrons, a p-type semiconductor layer supplying holes, an active layer formed between the n-type and p-type semiconductor layers, a first reflective layer formed on a bottom portion of the n-type semiconductor layer, and a second reflective layer formed on a top portion of the p-type semiconductor layer. The active layer may be configured to receive the electrons and the holes and emit light when the electrons couple to the holes. The light emitted from the active layer may exit toward a side of the active layer.

According to at least some example embodiments, the edge type LED may have a rectangular section taken parallel to the layers of the edge type LED. The rectangular section of the edge type LED may have a width to length ratio greater than or equal to about 1:3. The edge type LED may have a trapezoidal section taken parallel to the layers of the edge type LED. The first and second reflective layers may be formed of a metal. The first and second reflective layers may have a refraction index lower than that of the active layer. The first and second reflective layers may be spaced apart from each other by a distance less than or equal to about 10 μm. The edge type LED may further include a cladding layer formed between the n-type semiconductor layer and the active layer, and another cladding layer formed between the p-type semiconductor layer and the active layer.

At least one other example embodiment provides a light emitting diode. According to at least this example embodiment, the light emitting diode may include a first semiconductor layer for supplying electrons and a second semiconductor layer for supplying holes. The second semiconductor layer may different from the first. An active layer may be formed between the first and second semiconductor layers, may receive electrons and holes, and may emit light in response to coupling between the electrons and the holes. A first reflective layer may be formed on a bottom portion of the first semiconductor layer, and a second reflective layer may be formed on a top portion of the second semiconductor layer. The light emitted from the active layer may exit toward a side of the active layer.

At least one other example embodiment provides a display apparatus. According to at least this example embodiment, the display apparatus may include a light source including at least one light emitting diode, and a liquid crystal panel forming an image using light emitted from the light source. The light emitting diode may include a first semiconductor layer for supplying electrons and a second semiconductor layer for supplying holes. The second semiconductor layer may different from the first. An active layer may be formed between the first and second semiconductor layers, may receive electrons and holes, and may emit light in response to coupling between the electrons and the holes. A first reflective layer may be formed on a bottom portion of the first semiconductor layer, and a second reflective layer may be formed on a top portion of the second semiconductor layer. The light emitted from the active layer may exit toward a side of the active layer.

According to at least some example embodiments, the light emitting diode may have a rectangular section taken parallel to the layers of the light emitting diode. The rectangular section of the light emitting diode may have a width to length ratio greater than or equal to about 1:3. The light emitting diode may have a trapezoidal section taken parallel to the layers of the light emitting diode. The first and second reflective layers may be formed of a metal. The first and second reflective layers may have a refraction index lower than that of the active layer. The first and second reflective layers may be spaced apart from each other by a distance less than or equal to about 10 μm. The light emitting diode may further include a cladding layer formed between the n-type semiconductor layer and the active layer, and another cladding layer formed between the p-type semiconductor layer and the active layer.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1A:
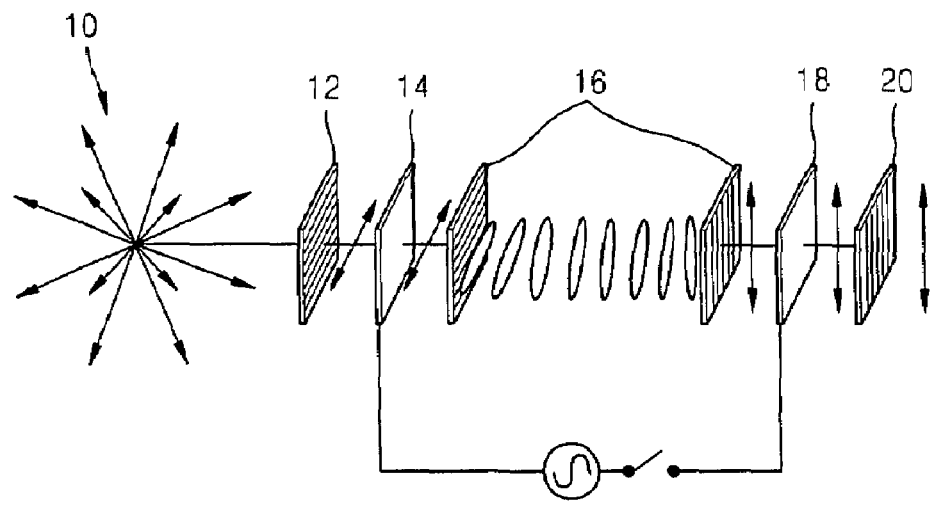
FIG. 1A illustrates how light is transmitted in a conventional liquid crystal display (LCD)

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 2:
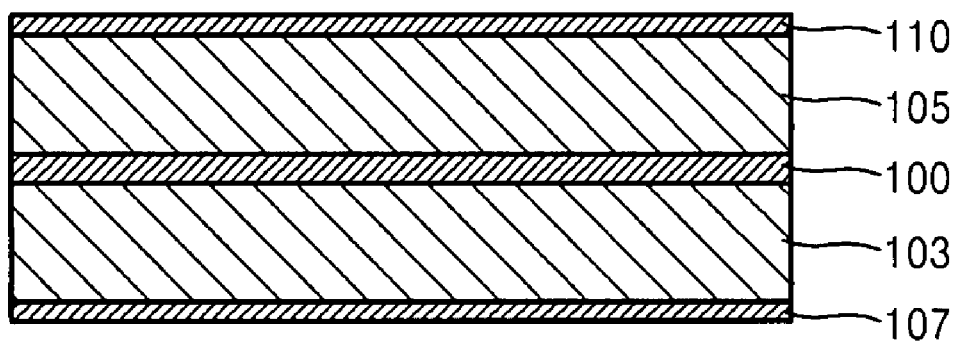
FIG. 2 is a cross-sectional view illustrating a light emitting diode (LED) according to an example embodiment.

FIG. 2 is a cross-sectional view illustrating a light emitting diode (LED, such as, an edge type LED) according to an example embodiment. For example purposes, example embodiments will be described with regard to an edge type LED.

Referring to FIG. 2, an edge type light emitting diode (LED) may include an active layer 100, a first semiconductor layer 103 and a second semiconductor layer 105. In this example, the first semiconductor layer 103 may be an n-type semiconductor material, and the second semiconductor layer 105 may be a p-type semiconductor layer; however, these materials may be interchanged.

The first semiconductor layer 103 may be configured to supply electrons to the active layer 100, and the second semiconductor layer 105 may be configured to supply holes to the active layer 100. The edge type LED may further include a first reflective layer 107 formed on a bottom surface of the first semiconductor layer 103 and a second reflective layer 110 formed on a top surface of the second semiconductor layer 105. Light emitted from the active layer 100 may be reflected by the first and second reflective layers 107 toward both sides of the LED.

Electrons and holes may be coupled in the active layer 100, and light may be emitted from the active layer 100 as a result of or in response to the coupling. The light emitted from the active layer 100 may be reflected by the first and second reflective layers 107 and 110, and thus, light may be emitted from both sides of the edge type LED.

Figure 3:
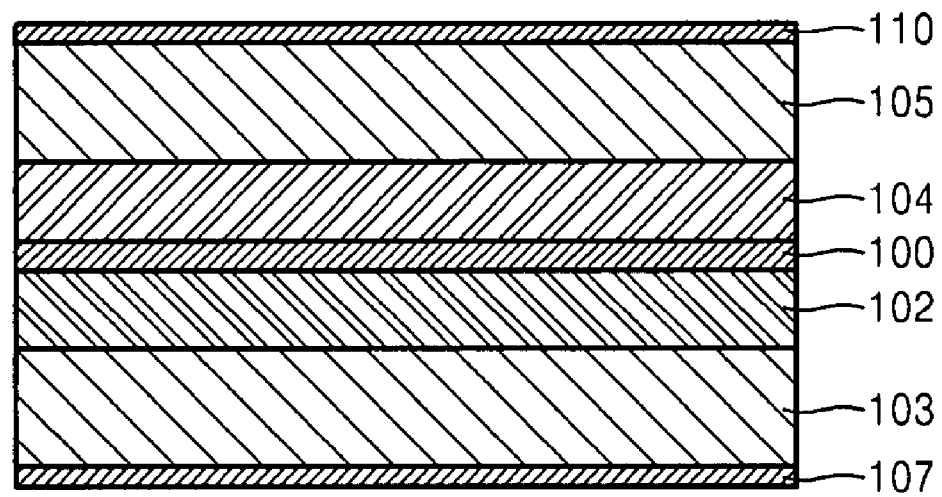
FIG. 3 is a cross-sectional view illustrating an LED according to another example embodiment.

FIG. 3 illustrates an LED (e.g., an edge type LED) according to another example embodiment. The edge type LED in FIG. 3 may be similar or substantially similar to the edge type LED shown in FIG. 2, however, the edge type LED in FIG. 3 may further include a first cladding layer 102 arranged between the active layer 100 and the first semiconductor layer 103, and a second cladding layer 104 arranged between the active layer 100 and the second semiconductor layer 105. In at least this example embodiment, the first cladding layer 102 may be an n-type cladding layer, and the second cladding layer 104 may be a p-type cladding layer. However, these materials may also be interchangeable according to the material composition of the first and second semiconductor layers 103 and 105, respectively.

The cladding layers 102 and 104 may be formed of materials having a refractive index lower than that of the reflective layers 107 and 110 so as to increase the reflectivity of the reflective layers 107 and 110.

Example characteristic of an LED according to an example embodiment will now be described in more detail. For example purposes, light emitted upward from the active layer 100 is considered to be non-polarized light, whereas light emitted laterally from the active layer 100 is considered to be polarized light.

Figure 4:
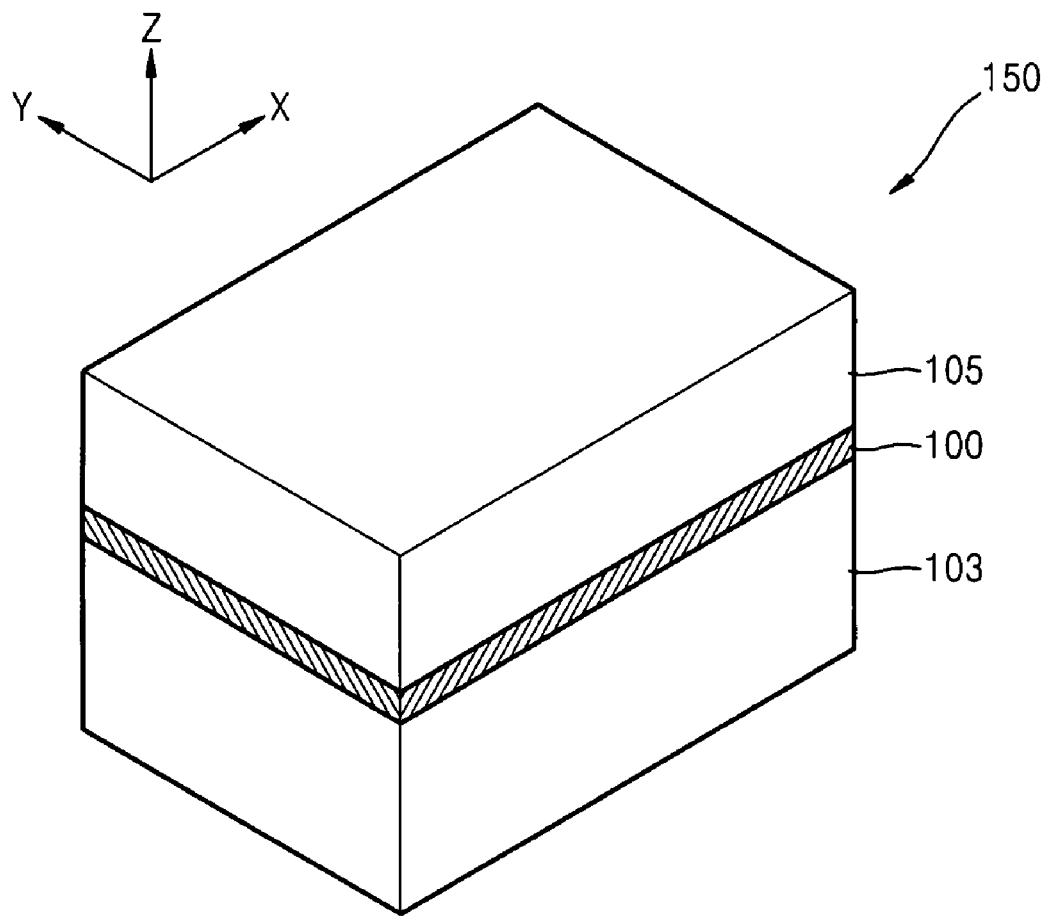
FIG. 4 is a perspective view illustrating an LED according to another example embodiment.

FIG. 4 is a perspective view illustrating an LED according to another example embodiment. As shown, the LED 150 may be similar or substantially similar to the LED of FIG. 2, and may include the active layer 100, the first semiconductor layer 103 and the second semiconductor layer 105. Polarization characteristics of light emitted from the LED 150 will be described in more detail below.

For example purposes, x and y axes denote directions parallel to the active layer 100 and the z-axis denotes a direction perpendicular to the active layer 100. As a result, light emitted from the active layer 100 may be expressed using electric field vector $\vec{E}$ as shown below in Equation 1.

$$\vec{E} = \hat{e} E_0 e^{i\vec{k}\cdot\vec{r}}$$ [Equation 1]

In Equation 1, $E_0$ is the electric field strength, $\vec{k}$ is a wave vector indicating the traveling direction of light, $\vec{r}$ is a radius vector, and unit vector ê indicates the polarization direction of light. Unit vector ê may be expressed as shown below in Equation 2.

$$\hat{e} = [e_x \hat{x} + e_y \hat{y} + e_z \hat{z}]$$ [Equation 2]

The wave vector $\vec{k}$ may be expressed as shown below in Equation 3.

$$\vec{k} = [k_x \hat{x} + k_y \hat{y} + k_z \hat{z}]$$ [Equation 3]

If the polarization direction of light is perpendicular to the traveling direction of the light, $\vec{k} \cdot \hat{e} = 0$. When a relatively large portion (e.g., most, substantially all, etc.) light is emitted upward from the active layer 100, the wave vector $\vec{k}$ of the light is substantially in the z-axis direction. As a result, the z-axis component of the polarization unit vector ê may be about zero (e.g., $e_z = 0$) because the polarization direction of the light is perpendicular to the wave vector $\vec{k}$. In this example, the polarization unit vector ê may have x-axis and y-axis components only as shown below in Equation 4.

$$\hat{e} \approx n_x \hat{x} + n_y \hat{y}$$ [Equation 4]

Because the x-axis and y-axis components of the polarization unit vector ê have the same or substantially the same magnitude, the light emitted upward from the active layer 100 may not be polarized. On the other hand, when a relatively large portion (e.g., most, substantially all, etc.) of the light is emitted laterally from the active layer 100, the light may be polarized. For example, when a relatively large portion (e.g., most, substantially all, etc.) of the light is emitted from the active layer 100 in the x-axis direction, the wave vector $\vec{k}$ of the light may be expressed as $k_x \hat{x}$ ($\vec{k} \approx k_x \hat{x}$), and the x-axis component of the polarization unit vector ê may be equal or substantially equal to about zero (e.g., $e_x = 0$). Because the thickness (z-direction) of the active layer 100 may be relatively small compared to those of the first and second semiconductor layers 103 and 105, Equation 5 below may be satisfied.

$$e_x^2 + e_y^2 >> e_z^2$$ [Equation 5]

Referring to Equation 5, the term $e_z^2$ may be disregarded if $e_z$ is small, relatively small or substantially smaller compared to $e_x$ and $e_y$. Furthermore, because $e_x = 0$, only the term $e_y^2$ remains. In at least this example, when light is emitted from the active layer 100 in the x-axis direction, the light may be polarized in the y-axis direction. Similarly, when light is emitted from the active layer 100 in the y-axis direction, the light may be polarized in the x-axis direction.

Figure 5:
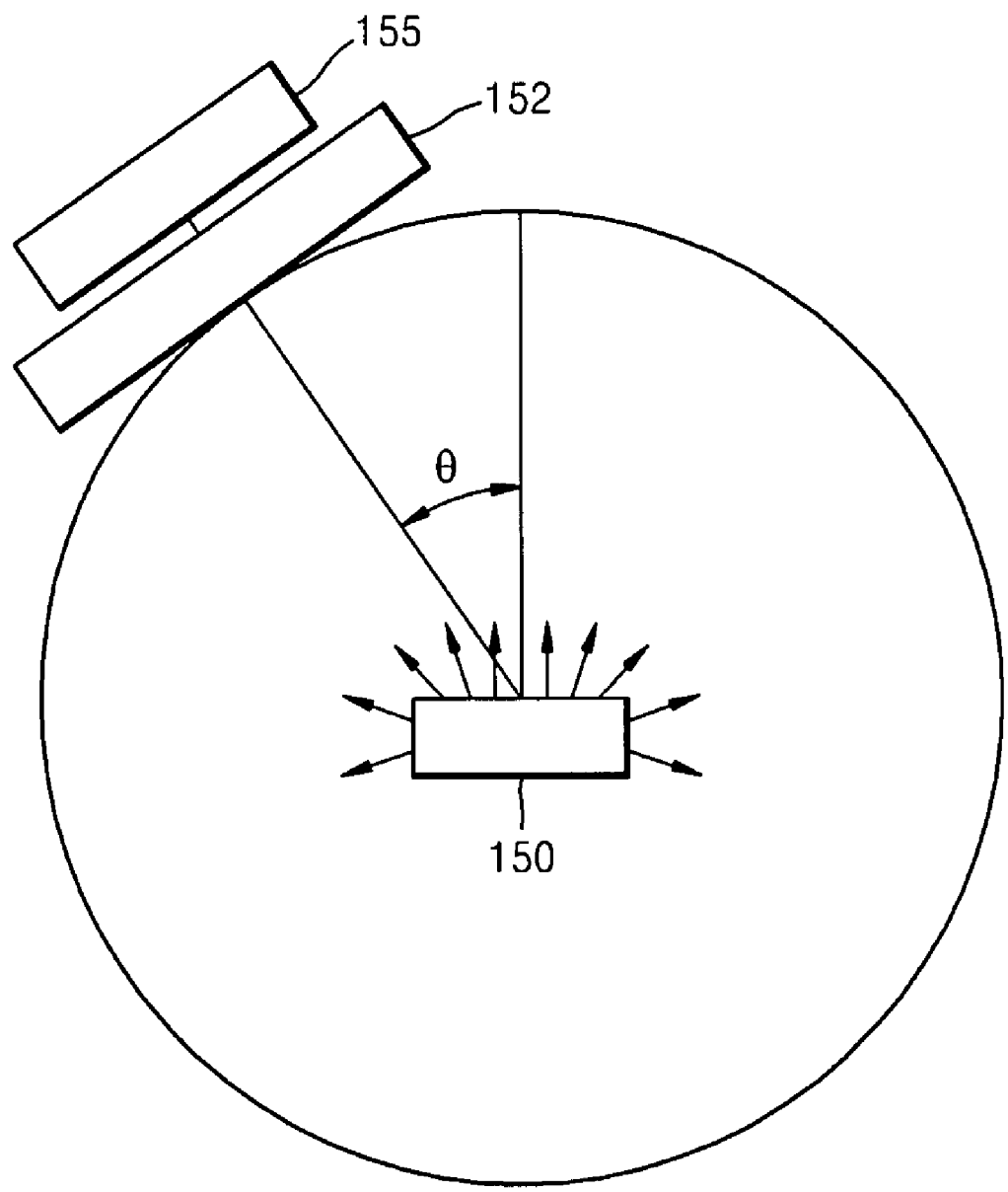
FIG. 5 is a schematic view illustrating a detection system for detecting polarization characteristics of light according to an example embodiment.

FIG. 5 is a schematic view illustrating a detection system for detecting the optical intensity of light according to an example embodiment. The example embodiment shown in FIG. 5 will be discussed with regard to light emitted from the LED 150 of FIG. 4.

Figure 6:
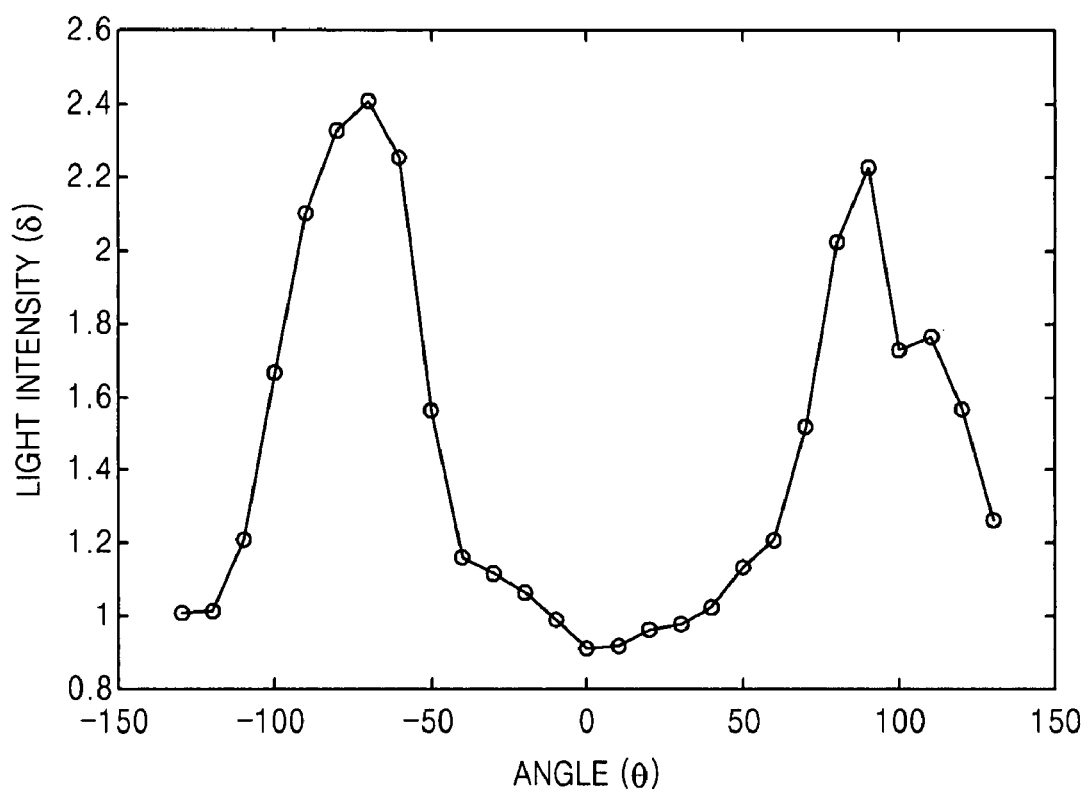
FIG. 6 is a graph illustrating light intensity with respect to angle θ detected using the detection system of FIG. 5.

Referring to FIG. 5, in the detection system, light emitted from the LED 150 may be incident on a detector 155 through a polarizer 152. When a line normal to a top surface of the LED 150 makes an angle θ with a line drawn between the polarizer 152 and the LED 150, a vertical/horizontal polarization intensity ratio curve may be drawn with respect to the angle θ in FIG. 6. Referring to FIG. 6, the polarization intensity may be high or relatively high (e.g., maximal) when the angle θ ranges between about 50° and 100°, inclusive. For example, a relatively large portion (e.g., most, substantially all, etc.) of the light emitted upward from the LED 150 may be non-polarized light, whereas a relatively large portion (e.g., most, substantially all, etc.) of the light emitted laterally from the LED 150 may be polarized light.

According to at least this example embodiment, the LED 150 may be designed to emit light in a lateral direction of the active layer 100 instead of emitting light in an upward direction of the active layer 100 so as to emit polarized light. Referring to the LEDs of FIGS. 2 and/or 3, the first reflective layer 107 may be formed on a bottom surface of the first semiconductor layer 103, and the second reflective layer 110 may be formed on a top surface of the second semiconductor layer 105. When electrons and holes are coupled in the active layer 100, light may be emitted from the active layer 100. The light emitted from the active layer 100 may be reflected by the first and second reflective layers 107 and 110. For example, the first and second reflective layers 107 and 110 may suppress and/or prevent light from being emitted upward from the LED. The light reflected from the first and second reflective layers 107 and 110 may be directed toward both sides of the active layer 100. As a result, a relatively large portion (e.g., most, substantially all, etc.) of the light may be emitted from the LED in a lateral direction of the active layer 100, and thus, the LED may provide polarized light.

Figure 7:
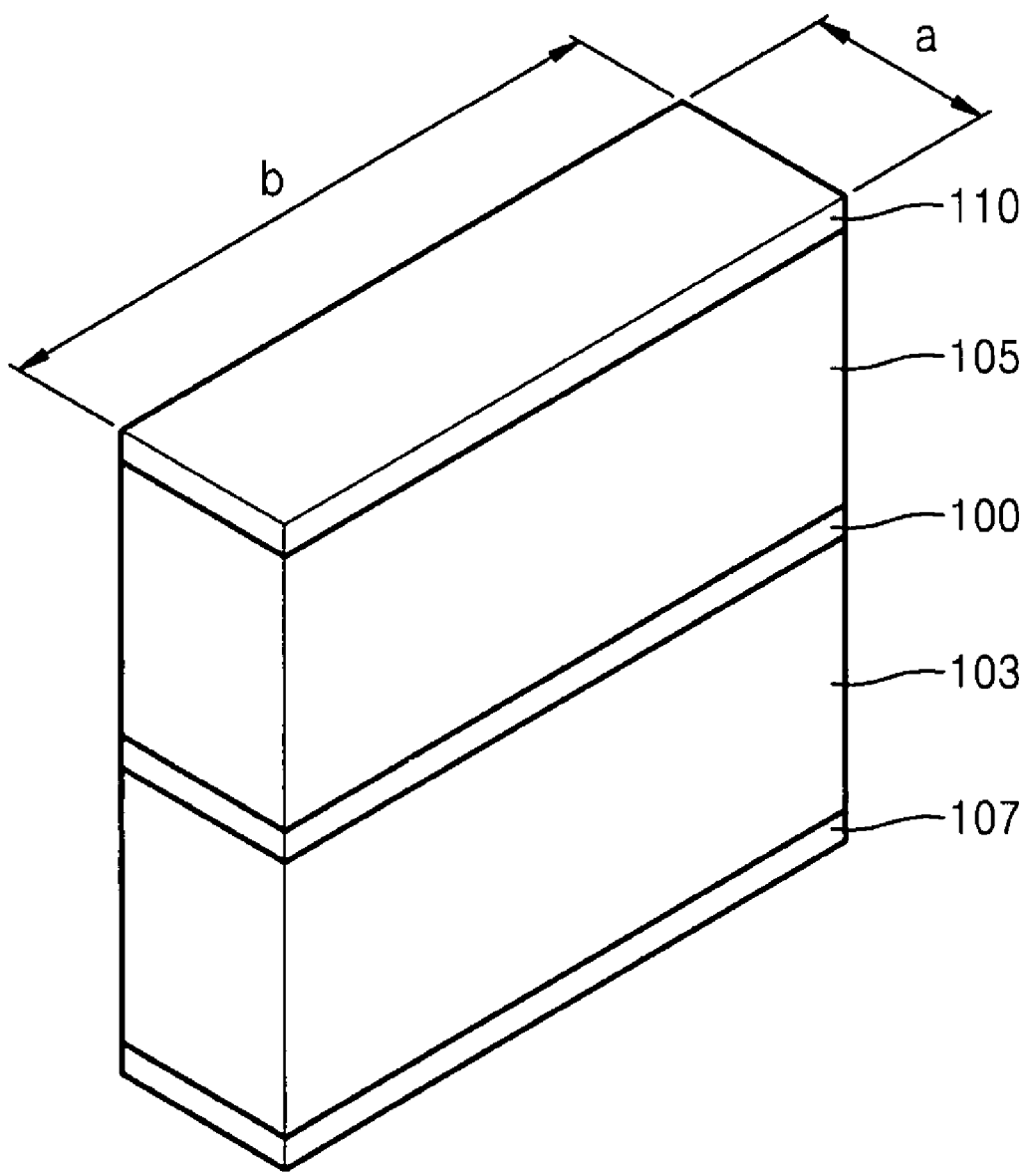
FIG. 7 is a perspective view illustrating an LED according to an example embodiment.

LEDs according to at least some example embodiments may have a tetragonal cross section. For example, an LED may have a rectangular cross section. When the LED has a rectangular cross section, the width (a) to length (b) ratio of the LED may be greater than or equal to about 1:3 (e.g., see FIG. 7). If an LED according to an example embodiment is used as a light source in a display apparatus, light emitted from one side of the active layer 100 may be used mainly, although light may be emitted from both sides of the active layer 100. In at least this example, one side of the active layer 100 may be longer than the other side to increase an effective light emitting length.

In addition, because light emitted from one side of the active layer 100 may be used mainly, LEDs according to example embodiments may have a trapezoidal or parallelogram shape although light is emitted from both sides of the active layer 100. In at least this example, light emitted from a longer side of two parallel sides of the trapezoidal or parallelogram LED may be used.

According to at least some example embodiments, the first and second reflective layers 107 and 110 may be formed of a material having a relatively high reflectivity to increase the amount of polarized light emitted from the LED. For example, the first and second reflective layers 107 and 110 may be formed of metal, a metallic material or a semi-metallic material having sufficient reflective properties. Furthermore, the first and second reflective layers 107 and 110 may be formed of a material having a refractive index lower than that of the active layer 100. In this example, light incident on the first and second reflective layers 107 and 110 at an angle greater than a critical angle may be reflected (e.g., totally or completely reflected).

According to at least some example embodiments, the polarization intensity ratio of the LED may increase in reverse proportion to the thickness of the LED. For example, the polarization intensity ratio of the LED may be increased by reducing light emitted from the LED in the z-axis direction. The first and second reflective layers 107 and 110 may be spaced apart a distance less than or equal to about 10 μm.

According to at least some example embodiments, LEDs may be designed to emit light in a lateral direction rather than in an upward direction to provide more polarized light. Thus, when an LED is used in a display apparatus using the polarization characteristics of light, the optical efficiency of the display apparatus may be increased. For example, the LED may be used in display apparatus such as an LCD or a projection system that displays an image using a liquid crystal panel. In an LCD, LEDs according to at least some example embodiments may be used as a back light unit, and in a projection system LEDs may be used as a light source. Structures of LCDs and projection systems are well known, and thus, descriptions thereof will be omitted for the sake of brevity.

Because LEDs according to at least some example embodiments may emit polarized light, the LEDs may increase the optical efficiency of a display apparatus employing the LED. For example, a display apparatus employing an LED according to an example embodiment need not polarize light emitted from a light source, and thus, the optical efficiency of the display apparatus may be increased.

Figure 1B:
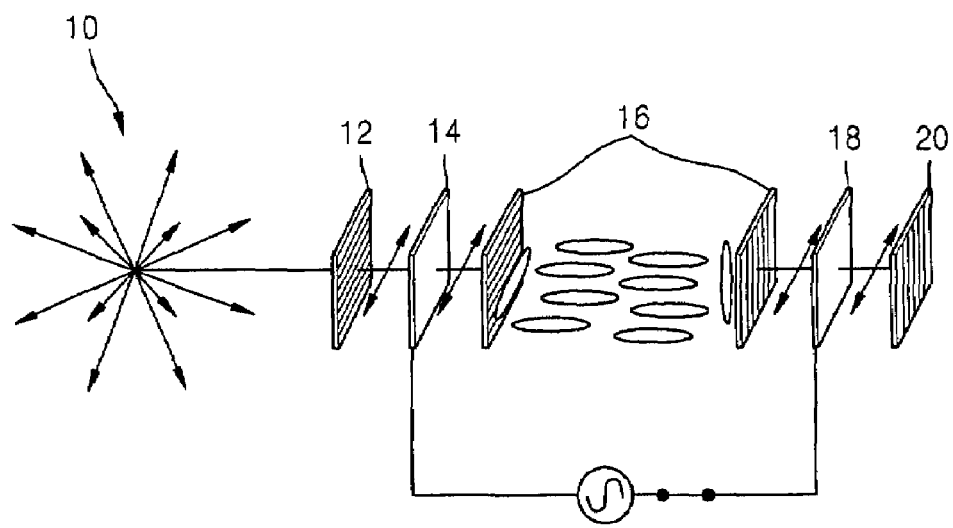
FIG. 1B illustrates how light is blocked in a conventional liquid crystal display (LCD)

For example, an LED according to an example embodiment may be used as a light source in a display device such as the LCD or projection system shown in FIGS. 1A and 1B. In at least this example embodiment, the first polarizer 12 and/or the second polarizer 20 may be omitted.

As described above, LEDs according to at least some example embodiments provide polarized light by increasing light emitted laterally from the active layer and/or reducing light emitted upward from the active layer. To do so, according to at least one example embodiment, reflective layers may be formed on top and bottom surface of the LED, respectively.

According to at least some example embodiments, in a display apparatus using an LED according to at least one example embodiment, a polarizer for polarizing light need not be included. Thus, optical efficiency of the display apparatus may be increased.

While example embodiments have been particularly shown and described with reference to the drawings, it will be understood by those of ordinary skill in the art that various changes in form and details may be made therein without departing from the spirit and scope of the present invention as defined by the following claims.

What is claimed is:

1. A light emitting diode comprising:
a first semiconductor layer for supplying electrons;
a second semiconductor layer for supplying holes, the second semiconductor layer being different from the first;
an active layer formed between the first and second semiconductor layers, the active layer receiving the electrons and the holes, and emitting light in response to coupling between the electrons and the holes;
a first reflective layer formed on a bottom portion of the first semiconductor layer; and
a second reflective layer formed on a top portion of the second semiconductor layer; wherein
the light emitted from the active layer exits at a side of the active layer.

2. The light emitting diode of claim 1, wherein the light emitting diode has a rectangular section parallel to the layers of the light emitting diode.

3. The light emitting diode of claim 2, wherein the rectangular section of the light emitting diode has a width to length ratio greater than or equal to about 1:3.

4. The light emitting diode of claim 1, wherein the light emitting diode has a trapezoidal section parallel to the layers of the light emitting diode.

5. The light emitting diode of claim 1, wherein the first and second reflective layers are formed of a metal, a metallic material or a reflective material.

6. The light emitting diode of claim 1, wherein the first and second reflective layers have a refractive index lower than a refractive index of the active layer.

7. The light emitting diode of claim 1, wherein the first and second reflective layers are spaced apart from each other by a distance less than or equal to about 10 μm.

8. The light emitting diode of claim 1, further including,
a first cladding layer formed between the first semiconductor layer and the active layer; and
a second cladding layer formed between the second semiconductor layer and the active layer.

9. The light emitting diode of claim 1, wherein the first semiconductor layer is an n-type semiconductor layer.

10. The light emitting diode of claim 1, wherein the second semiconductor layer is a p-type semiconductor layer.

11. A display apparatus comprising:
a light source including at least one light emitting diode of claim 1; and
a liquid crystal panel forming an image using light emitted from the light source.

12. The display apparatus of claim 11, wherein the light emitting diode has a rectangular section parallel to the layers of the light emitting diode.

13. The display apparatus of claim 12, wherein the rectangular section of the light emitting diode has a width to length ratio greater than or equal to about 1:3.

14. The display apparatus of claim 11, wherein the light emitting diode has a trapezoidal section parallel to the layers of the light emitting diode.

15. The display apparatus of claim 11, wherein the first and second reflective layers are formed of a metal or metallic material.

16. The display apparatus of claim 11, wherein the first and second reflective layers have a refractive index lower than a refractive index of the active layer.

17. The display apparatus of claim 11, wherein the first and second reflective layers are spaced apart from each other by a distance less than or equal to about 10 μm.

18. The display apparatus of claim 11, wherein the light emitting diode further includes,
a first cladding layer formed between the first semiconductor layer and the active layer; and
a second cladding layer formed between the second semiconductor layer and the active layer.

19. The display apparatus of claim 11, wherein the display apparatus is a liquid crystal display or a projection system.

20. The display apparatus of claim 11, wherein the first semiconductor layer is an n-type semiconductor layer.

21. The display apparatus of claim 11, wherein the second semiconductor layer is a p-type semiconductor layer.

* * * * *